Figure 1:
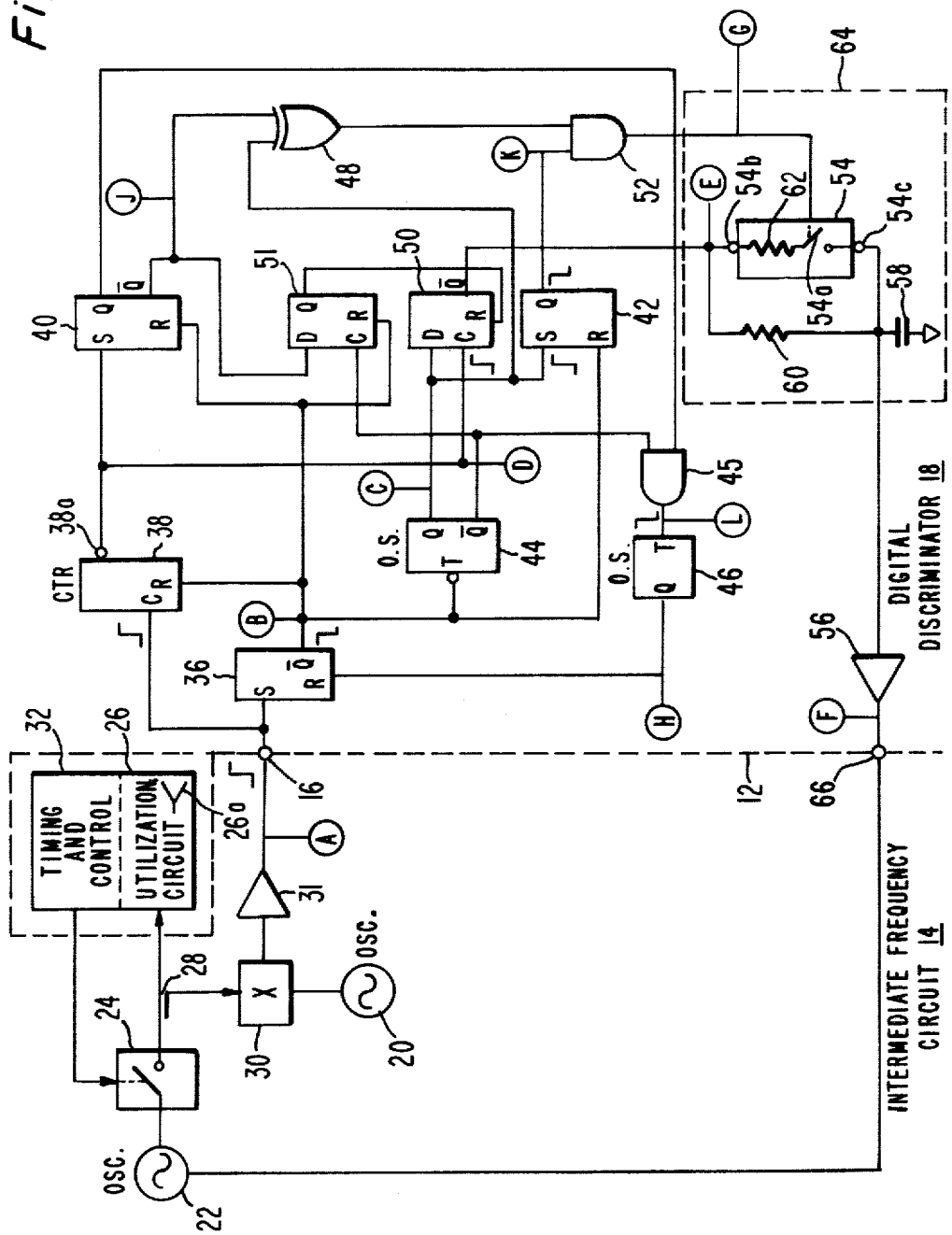

United States Patent
Johnson et al.

[11] 4,305,151
[45] Dec. 8, 1981

[54] DIGITAL DISCRIMINATOR FOR DETERMINING FREQUENCY ERROR OF AN OSCILLATOR

[75] Inventors: Henry C. Johnson, Neshanic, N.J.; Ronald W. Kipp, Croydon Manor, Pa.

[73] Assignee: Sperry Corporation, New York, N.Y.

[21] Appl. No.: 44,087

[22] Filed: May 31, 1979

[51] Int. Cl.³ .................... H04L 27/22; H04L 27/14
[52] U.S. Cl. ...................................... 375/81; 375/82; 329/122
[58] Field of Search ................. 331/1 A, 25; 307/210; 328/133; 325/320; 178/69.1; 375/81, 82; 329/122

[56] References Cited
U.S. PATENT DOCUMENTS

| | | | |
|---|---|---|---|
| 3,674,935 | 7/1972 | Lawrence | 375/81 |
| 3,813,604 | 5/1974 | Denoncourt | 329/122 |
| 3,879,665 | 4/1975 | Carlow et al. | 375/82 |
| 3,906,376 | 9/1975 | Bass | 375/81 |
| 4,129,748 | 12/1978 | Saylor | 178/69.1 |
| 4,169,256 | 9/1979 | Bergman et al. | 325/307 |

Primary Examiner—Marshall M. Curtis
Attorney, Agent, or Firm—Howard P. Terry

[57] ABSTRACT

An adjustable alternating signal having a desired period, P, is applied to a cycle counter arranged to count n cycles and applied to a timer arranged to time out n·P after a first cycle is applied to the counter and timer. A comparator is coupled to the counter and timer to determine whether the counter reaches its count of n cycles first or whether the timer times out first indicating that the period of the alternating signal is shorter or longer, respectively, than desired. An integrator is responsive to the signal from the comparator for changing the alternating signal which achieves the desired period.

10 Claims, 3 Drawing Figures

DIGITAL DISCRIMINATOR FOR DETERMINING FREQUENCY ERROR OF AN OSCILLATOR

Digital discriminators are known in the prior art for producing a voltage corresponding to the frequency of an alternating signal applied to the discriminator which voltage is used to perform some desired function such as maintaining the alternating signal at a desired frequency and period. Such prior art digital discriminators utilize an independent clock source to perform vital timing functions within the discriminator. Such clock pulses cause what are known as "spurs" or noise in the output signal, which are due to the coupling and intermodulation between the digital frequency of a reference source and the RF mixer. The mixer and IF frequency components are sensitive to very low values of signal amplitude such as the spur. When the digitizer is used to control the frequency of a radio frequency oscillator, the spurs undesirably add to the noise, i.e. error, of the system.

In accordance with the invention no clock source is utilized. Rather a counter means is responsive to the alternating signal from the RF mixer for counting successive cycles thereof and for producing a pulse when n cycles have been counted. A timer means is responsive to the first of the n successive cycles for producing a second signal at a time which is n times the desired period of the alternating signal. A means is responsive to the first signal and second signal for producing a third signal indicative of which of the first and second signals occurred first and therefore whether the period of the alternating signal is shorter or longer than desired. A means is responsive to the third signal for altering the period of the alternating signal in a direction to achieve said desired period. In one embodiment of the invention a means is responsive to the time lapse between the occurrence of the first signal and the occurrence of the second signal for controlling the rate at which the period of the alternating signal is changed.

Figure 2:
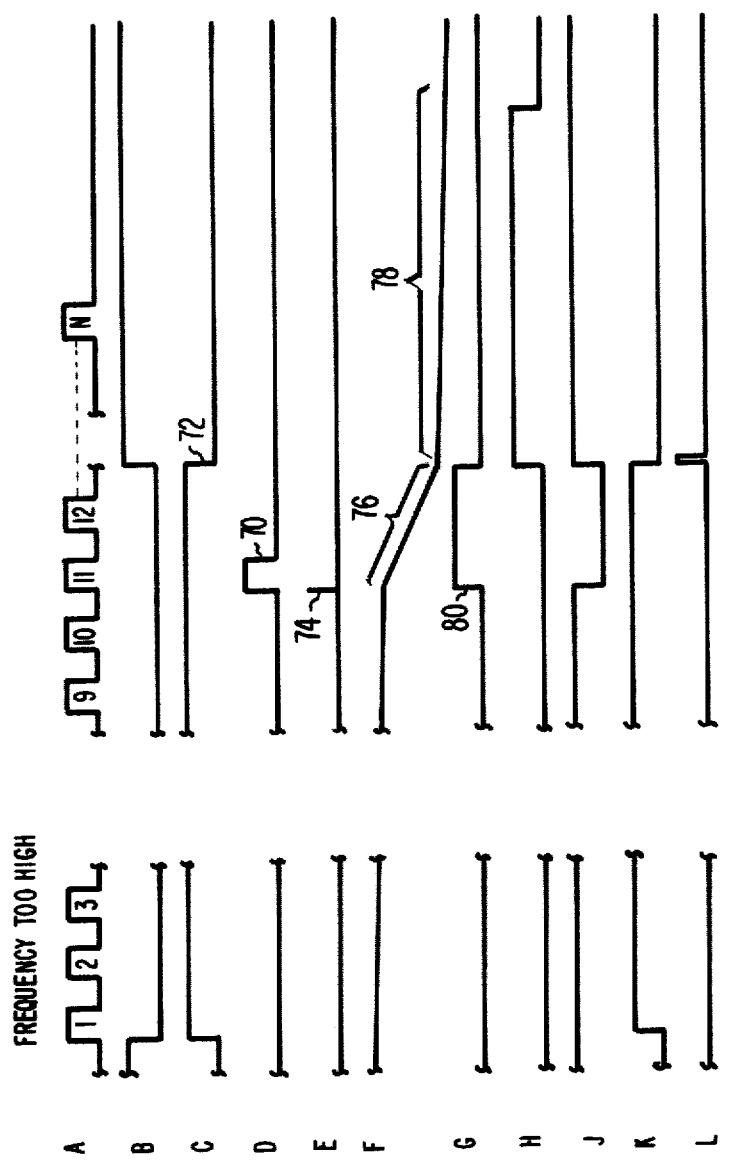
Figure 3:
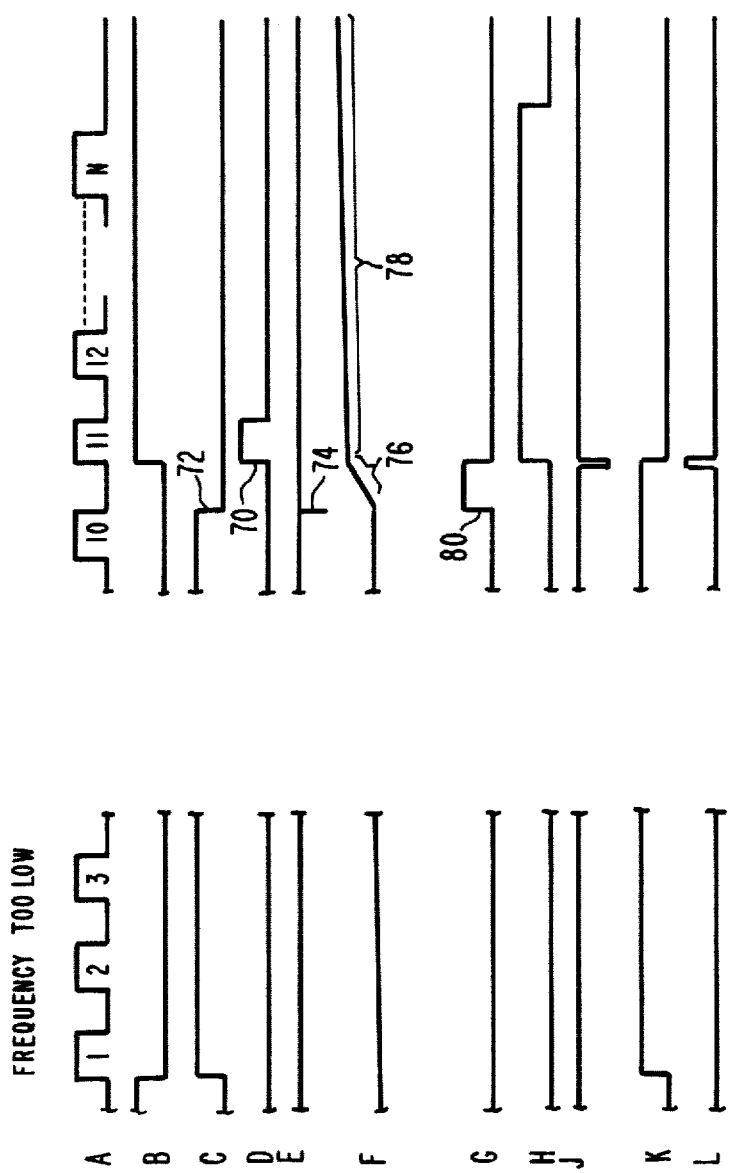

In the drawing, FIG. 1 is a digital discriminator circuit in block diagram form in accordance with the invention utilized for control of frequency of a voltage controlled oscillator in an intermediate frequency producing circuit; and FIGS. 2 and 3 are two sets of waveforms useful in understanding the circuit of FIG. 1.

As shown in FIG. 1, the circuit to the left of dashed line 12 is an intermediate frequency circuit 14 producing an intermediate frequency (IF) signal at terminal 16 the period of which varies but is desirably P where P may be for example, 1÷3 MHz. The circuit to the right of line 12 is a digital discriminator 18 for producing signals to maintain the desired period of the IF signal appearing at terminal 16. Block 26 lies neither in intermediate frequency circuit 14 nor in digital discriminator 18 but rather is a circuit which utilizes a radio frequency (RF) signal produced by circuit 14.

IF circuit 14 comprises a first reference oscillator 20 such as a transferred electron oscillator, producing a first frequency, $f_1$, which desirably though not necessarily is a given frequency such as 9342 MHz, and a second oscillator such as a voltage controlled oscillator (VCO) 22 producing a frequency $f_2$, which may ideally be, for example, 9345 MHz. IF circuit 14 also comprises an electronic switch 24 coupled between oscillator 22 and utilization circuit 26, a coupler 28 coupled to pass frequency $f_2$ when switch 24 is closed, and a subtractive or low pass mixer 30 receptive of frequency $f_1$ and frequency $f_2$ (when present) for producing an IF signal which is the difference of $f_1$ and $f_2$ which may be, for example, 3 MHz. Mixer 30 being a low pass mixer produces zero frequency when switch 24 is open because only frequency $f_1$ is present. The IF signal produced by mixer 30 is amplified and clipped by amplifier 31 which therefore produces a square wave signal at terminal 16.

Utilization circuit 26 which may be, for example, the transmitter portion of an airborne weather radar system and may include a transmitting antenna 26a may also include a timing and control circuit (T/C) 32 which comprises a crystal oscillator for master timing control and comprises other circuits producing pulses at desired times. One such succession of pulses may be utilized to control the period of opening and closing of switch 24 and the time duration that the switch is closed during each period. For example, T/C 32 may produce 288 pulses per second, each pulse having a time duration of 10 microseconds, thus closing switch 24 for 10 microseconds each 1÷288 seconds. For the exemplary figures given therefor, amplifier 31 produces about 30 cycles of 3 MHz signals 288 times a second.

The alternating frequency signal produced at terminal 16 is applied to the set (S) terminal of a flip-flop 36 and to the count (C) terminal of a counting means 38. Counter 38, when not reset by a logic 1 (relatively positive signal) at its reset (R) terminal, counts pulses received at its C terminal and produces at its output terminal 38a a logic 1 signal for each count of n where n is an integer such as for example 10.

The $\overline{Q}$ output terminal of flip-flop 36 is connected to the R terminal of each of counter 38, flip-flops 40, 42 and 51 and to the inverting trigger (T) terminal of a timing means such as a one shot circuit 44. One shot 44 is responsive to a logic 0 (relatively negative signal) trigger pulse for producing at its Q output terminal a logic 1 pulse which terminates n·P later where n is the number of counts counted by counter 38 and P is the desired period of the IF signal produced at terminal 16.

The Q output terminal of one shot 44 is coupled to the S terminal of flip-flop 42, to one input terminal of an exclusive OR gate 48 and to the D terminal of a D type flip-flop 50. The $\overline{Q}$ terminal of one shot 44 is coupled to an input terminal of an AND gate 45 and to the clock (C) terminal of a second D type flip-flop 51. The output of AND gate 45 is connected to the T terminal of one shot 46. Its Q output terminal in turn is connected to the R terminal of flip-flop 36.

The output terminal 38a of counter 38 is coupled to the C terminal of flip-flop 50 and to the S terminal of flip-flop 40. The Q output terminal of flip-flop 40 is coupled to a second input terminal of AND gate 45. The Q output terminal of flip-flop 40 is coupled to the second terminal of exclusive OR gate 48 and to the D terminal of flip-flop 51. The Q terminal of flip-flop 51 is coupled to the R terminal of flip-flop 50. Flip-flops 50 and 51 are of the type which upon receipt of the C terminal of a logic 1 will be set to produce at the Q output terminal the value (logic 1 or logic 0) of the signal applied at the D terminal. A logic 1 signal applied at the R terminal causes the flip-flop to be reset (Q=logic 0). Flip-flop 50 is a means to determine whether the counter means 38 counts n cycles first or whether one shot 44 times out first. Exclusive OR gate 48 is a proportional means for determining the time lapse between when counter 38 reaches a count of n and when one shot 44 times out. Exclusive OR gate 48 and the Q output terminal of flip-flop 42 are coupled to respective inputs of an AND gate 52 which is coupled to control the position of switch arm 54a of an electronic switch 54. The $\overline{Q}$ output terminal of flip-flop 50 is connected to terminal 54b of switch 54 while terminal 54c thereof is coupled to a low output impedance follower circuit 56 and to a capacitor 58 referenced to circuit ground. The ends of a resistor 60 are connected to terminals 54b and 54c respectively. Resistor 60 may be on the order of $20 \cdot 10^6$ ohms while capacitor 58 may be on the order of 10 microfarads. When switch 54 is closed, its internal resistance 62, about 200 ohms, is placed in parallel with resistor 60 which with capacitor 58 forms an integrating or RC time constant circuit 64. Follower 56, which, if necessary, may provide amplification, is connected to an output terminal 66 which is coupled to the control terminal of oscillator 22 to control its frequency. Integrator 64 serves as a means for controlling the frequency of oscillator 22.

Operation of the circuit of FIG. 1 is as follows. It will be initially assumed that oscillator 20 is producing a frequency $f_1$ of 9342 MHz and an oscillator 22 is producing a frequency $f_2$ of somewhat more or less than 9345 MHz in accordance with a control signal present at terminal 66. Therefore, when switch 24 is closed for $10\mu$ seconds every $1 \div 288$ seconds clipping circuit 31 is producing at terminal 16 a frequency which is somewhat more or less than 3 MHz. When switch 24 is open, mixer 30 produces no frequency. Upon the closing of switch 24 by T/C 32 the leading edge of the first logic 1 pulse at terminal 16 (i.e. the pulse labeled "1" in waveform A, FIG. 2 or 3) sets flip-flop 36 (see waveform B, FIGS. 2 or 3). The leading edge of the first pulse appearing at terminal 16 attempts to produce a count in counter 38 but the logic 1 $\overline{Q}$ signal from flip-flop 36, until it becomes set, prevents counter 38 from counting the first pulse. When flip-flop 36 becomes set, the logic 1 signal from the $\overline{Q}$ terminal of flip-flop 36 removes the reset signal from counter 38 and triggers one shot 44 causing its Q terminal to change from a logic 0 to a logic 1. (See waveform C, FIGS. 2 and 3). The logic 1 from one shot 44 sets flip-flop 42 priming AND gate 52. One shot 44 will continue to produce a logic 1 signal as illustrated in waveform C, FIGS. 2 and 3 for a time required for counter 38 to count 10 cycles of the frequency from mixer 30 if mixer 30 is producing exactly 3 MHz. Each of the next 10 pulses at terminal 16, those numbered 2-11 in FIGS. 2 and 3, change the count in counter 38 by one such that at the leading edge of the pulse numbered 11, waveform A, FIGS. 2 and 3, causes the counter 38 to produce a logic 1 pulse 70, waveform D, FIGS. 2 and 3. The leading edge of pulse 70 clocks into flip-flop 50 the value, logic 1 or logic 0 being produced at that instant by one shot 44.

In FIG. 2 the waveforms are drawn with the assumption that the frequency produced by mixer 30 is too high. In FIG. 3 the assumption is made that the frequency produced by mixer 30 is too low. The description of the operation hereinafter will first focus on the operation with the assumption that the frequency is too high and therefore that the waveforms of FIG. 2 are applicable and then will focus on a situation in which the frequency is too low and therefore the waveforms of FIG. 3 are applicable.

In FIG. 2, since the frequency is too high, counter 38 reaches a count of n or 10 in the example given before one shot 44 times out (changes from a logic 1 to a logic 0). When counter 38 counts 10 it produces pulse 70. The leading edge of pulse 70 clocks the value of one shot 44 Q terminal (a logic 1) into flip-flop 50, thus causing flip-flop 50 to be set. In accordance with waveform E, FIG. 2, flip-flop 50 was assumed to be already set so that line 74 merely represents the leading edge of pulse 70. Pulse 70 also sets flip-flop 40 thus causing it to produce a logic 0 signal at its $\overline{Q}$ terminal which logic 0 signal is applied to exclusive OR gate 48. The logic 1 pulse from one shot 44 still present is also applied at this time to exclusive OR gate 48 which forms a proportional pulse that equals the difference between when counter 38 reaches a count of n and when one shot 44 times out. Furthermore, since flip-flop 42 was set by the leading edge of the logic 1 pulse of one shot 44 a logic 1 signal is applied from the Q terminal of flip-flop 42 to AND gate 52. (See waveform K, FIG. 2). Therefore, a proportional logic 1 signal is generated by AND gate 52 which closes switch 54.

Switch 54 remains closed until one shot 44 times out at which time exclusive OR gate 48 is receiving two logic 0 pulses thus disabling AND gate 52 and opening switch 54. Since at the time switch 54 becomes closed flip-flop 50 is producing a logic 0 at its $\overline{Q}$ output terminal, a relatively low voltage such as zero volts which acts as a current sink is applied to terminal 54b acting as a current sink. Therefore, during the time switch 54 is closed capacitor 58 discharges at a rate which is determined by its value and that of resistors 62 and 60 in parallel. Since typically resistor 62 is much smaller in value than resistor 60 for example 200 ohms for resistor 62 verses 20 megohms for resistor 60 the discharge of capacitor 58 is determined exclusively by resistor 62 so long as switch 54 is closed.

The discharge of capacitor 58 results in a lower voltage being applied to oscillator 22 as indicated by waveform F, FIG. 2, and thus causing oscillator 22 to produce a reduced frequency. After one shot 44 times out and thus switch 54 opens the logic 0 produced at $\overline{Q}$ terminal of flip-flop 50 continues to act as a current sink at terminal 54b of switch 54. The voltage therefore at terminal 66 as applied to oscillator 22 continues to discharge until at least the next time switch 24 is closed as will be described hereinafter but at a rate now determined by the value of resistor 60 and capacitor 58, that is, at a rate which is much slower than that determined by resistor 62. The time constant determined by the value of resistor 60 and capacitor 58 is chosen to be many orders of magnitude larger than the period set by T/C 32 (i.e. $1 \div 288$ seconds) so that the frequency drift between pulses is negligible. When the switch is closed, as is the case when the circuit is off frequency, resistor 62 and resistor 60 are placed in parallel. Since the value of resistor 60 > the value of resistor 62, the resulting time constant is essentially resistor 62.capacitor 58. This value is typically chosen to be a few times greater than the period set by T/C 32 to insure rapid frequency acquisition.

Thus, the frequency of oscillator 22 continues to decrease in value proportional to the decrease in value of voltage applied thereto as shown in portion 78 of waveform F, FIG. 2. At the time that one shot 44 times out and therefore its Q terminal produces a logic 0, the $\overline{Q}$ terminal thereof produces a logic 1. The leading edge of that logic 1 signal performs two functions; (1) it clocks into D flip-flop 51 the value present at its D terminal, namely, the logic 0 from the Q terminal of flip-flop 40 thus producing a logic 0 at the $\overline{Q}$ output terminal of flip-flop 51 (Since the flip-flop was previously reset by the logic 1 pulse from the $\overline{Q}$ terminal of flip-flop 36 this pulsing by one shot 44 has no practical affect); (2) the logic 1 leading edge of the Q terminal of one shot 44 also is applied to AND gate 45 which further receives a logic 1 pulse from the Q terminal of flip-flop 40. Therefore, AND gate 45 produces a logic 1 signal which triggers one shot 46 to produce a logic 1 pulse at its Q output terminal. One shot 46 is designed to produce a logic 1 pulse which will terminate after T/C circuit 32 causes switch 24 to open and therefore mixer 30 is no longer producing an intermediate frequency. Thus, the timing of one shot 46 is non-critical and can be anywhere from approximately 10 microseconds to approximately 1÷288 hertz. The leading edge of the logic 1 signal from one shot 46 resets flip-flop 36 thus causing it to produce a logic 1 signal at its $\overline{Q}$ output terminal which resets counter 38 and maintains that counter in a non-counting condition, resets flip-flop 40, resets flip-flop 51 and resets flip-flop 42. As illustrated in the various waveforms of FIG. 2 these flip-flops and counter remain reset until they are once again set, as above-described, the next time that switch 24 is closed by T/C 32.

It it is now assumed that the frequency produced by mixer 30 is too low, the waveforms of FIG. 3 apply. Since in FIG. 3 the frequency is low, one shot 44 will time out prior to counter 38 reaching a count of 11 (i.e. having counted 10 pulses). When one shot 44 times out it produces a logic 0 at its Q output terminal. That logic 0 is applied to exclusive OR 48 and since the $\overline{Q}$ terminal of counter 40 is producing a logic 1 signal the exclusive OR gate produces a logic 1 signal which is applied to AND gate 52. Since AND gate 52 is also receiving a logic 1 signal from the Q terminal of flip-flop 42 a logic 1 signal appears at the output of AND GATE 52 which closes switch 54.

At the time that one shot 44 times out flip-flop 50 may be set or reset depending on whether in the preceeding cycle the frequency was too high or too low. If the frequency was too high, flip-flop 50 would be set producing a logic 0 at its $\overline{Q}$ terminal. Conversely, if the frequency was too low, flip-flop 50 would be reset producing a logic 1 at its $\overline{Q}$ terminal. When one shot 44 times out the logic 1 signal at its $\overline{Q}$ terminal will clock into flip-flop 51 the value applied at its D terminal namely a logic 1 signal. The resulting logic 1 signal at the Q terminal of flip-flop 51 will reset flip-flop 50 no matter what its condition was previously. Therefore, in effect when one shot 44 times out, flip-flop 50, no matter what its previous state, will be reset such that a logic 1 relatively positive voltage pulse will appear at terminal 54b of switch 54 acting as a current source. As a result, a positively increasing signal will be applied at terminal 66 increasing at a rate which is determined by resistor 62 and capacitor 58 (see portion 76 of waveform F, FIG. 3) causing oscillator 22 to increase in frequency. When counter 38 reaches its count of 10 on the 11th pulse from mixer 30, flip-flop 40 will be set placing a logic 0 on exclusive OR 48 thereby disabling AND gate 52 and thereby opening switch 54. The logic 1 produced at flip-flop 54 upon being set will enable AND gate 45, primed when one shot 44 timed out, to set one shot 46. The leading edge of the logic 1 pulse from one shot 46 resets flip-flop 36 producing at its Q terminal logic 1 which resets counter 38, resets flip-flop 40 and resets flip-flop 42, therefore insuring that flip-flop 50 will remain reset at least until the next time switch 24 is closed. Therefore, the voltage at terminal 66 and thus the voltage applied to oscillator 22 will increase at a rate determined by resistor 60 and capacitor 58 in the same manner that the voltage decreased as described in connection with FIG. 2.

It will be understood that the discriminator 18 will operate with a continuously applied alternating signal. With such a continuously applied alternating signal the output of AND gate 45 is coupled to the R terminal of flip-flop 36 and one shot 46 is eliminated.

What is claimed is:

1. A digital discriminator coupled to receive an alternating signal from an adjustable alternating signal source, said alternating signal being adjustable about a desired period, for providing a signal indicative of variations from the desired period comprising:

means coupled to receive a sequence of pulses including a first pulse, each pulse representing a period of said alternating signal for counting n successive pulses in said sequence and for providing a first signal at a time after reception of n said pulses, n being an integer greater than 1;

means responsive to said first pulse of said sequence for providing a second signal at a predetermined time thereafter, said predetermined time being substantially equal to n said desired periods;

means responsive to said first signal and said second signal for providing a third signal indicative of which of said first and second signals occurs first and thereby indicating whether said alternating signal period is shorter or longer than said desired period; and means coupled to said alternating signal source and responsive to said third signal for adjusting said alternating signal period in a direction to substantially achieve said desired period.

2. The combination of claim 1 wherein said means for adjusting said period comprises an integrating circuit.

3. The combination of claim 1 wherein said means producing said third signal is a D type flip-flop having a D input terminal to which is applied one of said first signal and second signal and a clock input terminal to which is applied the other of said first and second signals.

4. The combination of claim 1 further including means responsive to said first signal and said second signal for producing a fourth signal having one value between the time the first of said first and second signals occurs and the time the other of said first and second signals occurs and otherwise having another value.

5. The combination of claim 4 wherein said means for adjusting said period is an integrator having a first relatively short selectable time constant and a second relatively long selectable time constant, said fourth signal when present, causing said first time constant to be selected otherwise said second time constant being selected, said integrator, when said first time constant is selected, causing said alternating signal to be relatively rapidly adjusted toward said desired period, said integrator, when said second time constant is selected, causing said alternating signal to be relatively slowly adjusted toward said desired period.

6. The combination of claim 5 wherein said integrator comprises a capacitor a first resistor in series connection with said capacitor and the series combination of a controllable switch means and second resistor in parallel with said first resistor the junction of said first resistor and capacitor being coupled to said alternating signal source for varying the period thereof, the distal end of said first resistor being coupled to said means producing a third signal, the distal end of said capacitor coupled to ground said means producing said fourth signal being coupled to control said switch means to place said second resistor in parallel with said first resistor when said fourth signal has said one value.

7. The combination of claim 4 wherein said means producing said fourth signal comprises an exclusive OR gate to which are applied said first and second signals.

8. The combination of claim 1 wherein said means producing said second signal is a one shot.

9. The combination of claim 1 wherein said alternating signal source includes means to pass said alternating signal to said first signal producing means and second signal producing means only during given portions of successive time periods and wherein said discriminator further includes means responsive to said first signal and said second signal for producing a disable signal to disable said counting means and said second signal providing means from producing additional first signal and second signals until the next successive one of said time periods occurs.

10. The combination of claim 9 wherein said means producing said disable signal comprises an AND gate responsive to said first and second signal for producing a trigger signal and a one shot responsive to said trigger signal for producing said disable signal.

* * * * *